(12) United States Patent  
Morrison et al.

(10) Patent No.: US 12,209,866 B2  
(45) Date of Patent: Jan. 28, 2025

(54) ATOMIC SENSOR SYSTEM

(71) Applicants: Gordon Barbour Morrison, Summerland, CA (US); Michael D. Bulatowicz, Sun Prairie, WI (US); Michael S. Larsen, Woodland Hills, CA (US); Bob Buckley, Goleta, CA (US)

(72) Inventors: Gordon Barbour Morrison, Summerland, CA (US); Michael D. Bulatowicz, Sun Prairie, WI (US); Michael S. Larsen, Woodland Hills, CA (US); Bob Buckley, Goleta, CA (US)

(73) Assignees: NORTHROP GRUMMAN SYSTEMS CORPORATION, Falls Church, VA (US); FREEDOM PHOTONICS, LLC, Goleta, CA (US)

( * ) Notice: Subject to any disclaimer, the term of this patent is extended or adjusted under 35 U.S.C. 154(b) by 112 days.

(21) Appl. No.: 18/074,668

(22) Filed: Dec. 5, 2022

(65) Prior Publication Data

US 2023/0184553 A1 Jun. 15, 2023

Related U.S. Application Data

(60) Provisional application No. 63/289,947, filed on Dec. 15, 2021.

(51) Int. Cl.
*G01G 3/00* (2006.01)
*G01C 19/62* (2006.01)

(52) U.S. Cl.
CPC .................. *G01C 19/62* (2013.01)

(58) Field of Classification Search
CPC ....................................... A61G 1/02
(Continued)

(56) References Cited

U.S. PATENT DOCUMENTS

| 5,189,368 A | 2/1993 | Chase |
| 6,314,215 B1 | 11/2001 | Shay et al. |

(Continued)

FOREIGN PATENT DOCUMENTS

| CN | 110411481 A * 11/2019 | ........... G01C 25/005 |
| EP | 3223030 A1 * 9/2017 | ............. G01C 19/62 |

(Continued)

OTHER PUBLICATIONS

Perry, et al.: "An all-optical intrinsic atomic gradiometer with sub-20 fT/cm/sqrtrm Hz sensitivity in a 22 muT earth-scale magnetic field", arxiv.org, Cornell University Library, 201 Olin Library Cornell University Ithaca, NY 14853, Nov. 16, 2020 (Nov. 16, 2020), XP081814086.

(Continued)

*Primary Examiner* — Walter L Lindsay, Jr.
*Assistant Examiner* — Frederick Wenderoth
(74) *Attorney, Agent, or Firm* — Tarolli, Sundheim, Covell & Tummino LLP

(57) ABSTRACT

One example includes an atomic sensor system. The system includes an optical source configured to provide an optical beam and a plurality of sensor cell systems. Each of the sensor cell systems includes sensing media enclosed in a volume therein. The system also includes optics configured to provide the optical beam to each of the sensor cell systems to provide interaction of the optical beam with the vapor in each of the respective sensor cell systems. The optical beam exiting each of the sensor cell systems is a respective detection beam. The system further includes a detection system comprising at least one configured to receive the detection beam from each of the sensor cell systems and to determine a measurable parameter based on an optical characteristic associated with the detection beam from each of the sensor cell systems.

20 Claims, 4 Drawing Sheets

(58) Field of Classification Search
USPC .................................................... 324/301
See application file for complete search history.

(56) References Cited

U.S. PATENT DOCUMENTS

| | | | |
|---|---|---|---|
| 6,472,869 B1 | 10/2002 | Upschulte et al. |
| 7,038,450 B2 | 5/2006 | Romalis et al. |
| 7,145,333 B2 | 12/2006 | Romalis et al. |
| 7,521,928 B2 | 4/2009 | Romalis et al. |
| 7,826,065 B1 | 11/2010 | Okandan et al. |
| 7,856,065 B2 | 12/2010 | Jonsson |
| 7,994,783 B2 | 8/2011 | Ledbetter et al. |
| 8,054,074 B2 | 11/2011 | Ichihara et al. |
| 8,212,556 B1 | 7/2012 | Schwindt et al. |
| 8,300,566 B2 | 10/2012 | Kuo |
| 8,305,078 B2 | 11/2012 | Savukov et al. |
| 8,405,389 B2 | 3/2013 | Sugioka et al. |
| 8,421,455 B1 | 4/2013 | Hovde et al. |
| 8,519,705 B2 | 8/2013 | Savukov et al. |
| 8,587,304 B2 | 11/2013 | Budker et al. |
| 8,605,282 B2 | 12/2013 | Groswasser |
| 8,773,120 B2 | 7/2014 | Jager et al. |
| 9,116,201 B2 | 8/2015 | Shah et al. |
| 9,140,657 B2 | 9/2015 | Ledbetter et al. |
| 9,229,073 B2 | 1/2016 | Walker et al. |
| 9,366,735 B2 | 6/2016 | Kawabata et al. |
| 9,575,144 B2 | 2/2017 | Kornack et al. |
| 9,618,362 B2 | 4/2017 | Bulatowicz et al. |
| 9,638,768 B2 | 5/2017 | Foley et al. |
| 9,857,441 B2 | 1/2018 | Salit et al. |
| 9,869,731 B1 | 1/2018 | Hovde et al. |
| 9,927,501 B2 | 3/2018 | Kim et al. |
| 9,964,610 B2 | 5/2018 | Shah et al. |
| 9,995,800 B1 | 6/2018 | Schwindt et al. |
| 10,024,931 B2 | 7/2018 | Nagasaka et al. |
| 10,162,021 B2 | 12/2018 | Kawabata et al. |
| 10,215,816 B2 | 2/2019 | Kawabata et al. |
| 10,274,549 B1 | 4/2019 | Ledbetter et al. |
| 10,288,701 B2 | 5/2019 | Kobayashi et al. |
| 10,996,293 B2 | 5/2021 | Mohseni |
| 2005/0052650 A1 | 3/2005 | Wu |
| 2009/0243610 A1 | 10/2009 | Ichihara et al. |
| 2009/0256561 A1 | 10/2009 | Ledbetter et al. |
| 2010/0090697 A1 | 4/2010 | Savukov et al. |
| 2010/0156547 A1 | 6/2010 | McGuyer et al. |
| 2010/0289491 A1 | 11/2010 | Budker et al. |
| 2010/0308814 A1 | 12/2010 | Wu |
| 2011/0193555 A1 | 8/2011 | Sugioka et al. |
| 2011/0279115 A1 | 11/2011 | Tuchman |
| 2012/0112749 A1 | 5/2012 | Budker et al. |
| 2012/0176130 A1 | 7/2012 | Ledbetter et al. |
| 2013/0027041 A1 | 1/2013 | Savukov et al. |
| 2013/0214773 A1 | 8/2013 | Ueno |
| 2013/0265042 A1 | 10/2013 | Kawabata et al. |
| 2014/0111198 A1 | 4/2014 | Tuchman |
| 2014/0184216 A1 | 7/2014 | Walker et al. |
| 2014/0206981 A1 | 7/2014 | Nagasaka |
| 2014/0247045 A1 | 9/2014 | Kornack et al. |
| 2014/0375313 A1 | 12/2014 | Salit et al. |
| 2015/0042327 A1 | 2/2015 | Bulatowicz |
| 2015/0212168 A1 | 7/2015 | Shah et al. |
| 2015/0316625 A1 | 11/2015 | Bulatowicz |
| 2015/0330786 A1 | 11/2015 | Bulatowicz et al. |
| 2015/0346293 A1 | 12/2015 | Bulatowicz et al. |
| 2016/0116553 A1 | 4/2016 | Kim et al. |
| 2016/0146909 A1 | 5/2016 | Kawabata et al. |
| 2016/0223627 A1 | 8/2016 | Shah et al. |
| 2016/0231395 A1 | 8/2016 | Foley et al. |
| 2016/0313417 A1 | 10/2016 | Kawabata et al. |
| 2016/0334475 A1 | 11/2016 | Ueno |
| 2017/0276741 A1 | 9/2017 | Bulatowicz |
| 2017/0360322 A1 | 12/2017 | Ueno |
| 2018/0348313 A1 | 12/2018 | Bulatowicz et al. |
| 2018/0372813 A1 | 12/2018 | Bulatowicz et al. |
| 2019/0101611 A1 | 4/2019 | Bulatowicz et al. |
| 2019/0250223 A1 | 8/2019 | Palacios Laloy |
| 2019/0293736 A1 | 9/2019 | Bulatowicz |
| 2020/0309873 A1 | 10/2020 | Ledbetter et al. |

FOREIGN PATENT DOCUMENTS

| | | | | |
|---|---|---|---|---|
| EP | 3410142 A1 | 12/2018 | | |
| ES | 2348085 T3 | * 11/2010 | .......... | A61M 1/3693 |
| JP | 2015102492 | 6/2015 | | |
| JP | 2017026405 A | * 2/2017 | ............. | G01R 33/26 |
| JP | 2018-004462 A | 1/2018 | | |
| JP | 2018068934 | 5/2018 | | |
| RU | 2720055 C1 | * 4/2020 | | |

OTHER PUBLICATIONS

Extended European Search Report (EESR) for corresponding EP 22213437.1-1126, issued Apr. 25, 2023.

* cited by examiner

ATOMIC SENSOR SYSTEM

RELATED APPLICATIONS

The present invention claims priority from U.S. Provisional Patent Application No. 63/289,947, filed 15 Dec. 2021.

GOVERNMENT INTEREST

This invention was made with government support under H0014718C7434 awarded by the Missile Defense Agency. The government has certain rights in the invention.

TECHNICAL FIELD

The present invention relates generally to sensor systems, and specifically to an atomic sensor system.

BACKGROUND

Atomic sensor systems, such as nuclear magnetic resonance (NMR) gyroscopes and magnetometers and/or electron paramagnetic resonance (EPR) magnetometers, can include a sensor cell that contains sensing media, such as alkali metal vapors (e.g., rubidium or cesium) caused to precess in response to a magnetic field. The sensing media can be stimulated to an excited state in response to optical pumping in a given frequency band. As an example, in an NMR gyroscope system, the sensor cell can also include gyromagnetic isotopes that are caused to precess in response to a magnetic field. The signal processing circuitry can extract the Larmor precession frequency and/or phase information of the one or more gyromagnetic isotopes. As a result, a gyroscope rotation rate or orientation angle about the sensitive axis can be calculated based on the extracted Larmor precession frequencies and phase information. As another example, in a magnetometer system, the precession of the alkali metal vapor(s) can be monitored by an optical signal. A change in the precession resulting from an external magnetic field relative to the sensitive axis can thus be detected to provide for a measurement of the amplitude of the external magnetic field.

SUMMARY

One example includes an atomic sensor system. The system can include an optical source configured to provide an optical beam and a plurality of sensor cell systems. Each of the sensor cell systems can include sensing media enclosed in a volume therein. The system can also include optics configured to provide the optical beam to each of the sensor cell systems to provide interaction of the optical beam with the sensing media in each of the respective sensor cell systems. The optical beam exiting each of the sensor cell systems can be a respective detection beam. The system can further include a detection system comprising at least one configured to receive the detection beam from each of the sensor cell systems and to determine a measurable parameter based on an optical characteristic associated with the detection beam from each of the sensor cell systems.

Another example includes a method for determining a measurable parameter in an atomic sensor system. The method can include providing at least one optical beam to a plurality of sensor cell systems via optics to provide each of the at least one optical beam to each of the sensor cell systems to provide interaction of each of the at least one optical beam with sensing media in each of the respective sensor cell systems. Each one of the at least one optical beam exiting each of the sensor cell systems can be a respective detection beam. The method can further include monitoring the detection beam from each of the sensor cell systems to determine a measurable parameter based on an optical characteristic associated with the detection beam from each of the sensor cell systems.

Another system includes a three-axis atomic sensor system. The system can include an optical source configured to provide an optical beam. The system can also include a first sensor cell system comprising sensing media and a first magnetic field generator arranged to provide a first magnetic field in a first vector direction, a second sensor cell system comprising the sensing media and a second magnetic field generator arranged to provide a second magnetic field in a second vector direction different from the first vector direction and a third sensor cell system comprising the sensing media and a third magnetic field generator arranged to provide a third magnetic field in a third vector direction different from the first and second vector directions. The first, second, and third sensor cell systems can be arranged in a 1×3 array. The system can also include optics configured to provide the optical beam parallel with respect to the arrangement of the first, second, and third sensor cell systems in the 1×3 array. The optics can include a plurality of beamsplitters configured to provide a portion of the optical beam to each of the first, second, and third sensor cell systems to provide interaction of each of the respective optical beam with the sensing media in each of the respective first, second, and third sensor cell systems. The portion of the optical beam exiting each of the first, second, and third sensor cell systems can be provided as a respective detection beam. The system can further include a detection system comprising at least one photodetector configured to receive the detection beam from each of the first, second, and third sensor cell systems and to determine a measurable parameter based on an optical characteristic associated with the detection beam from each of the first, second, and third sensor cell systems.

DETAILED DESCRIPTION

Figure 1:
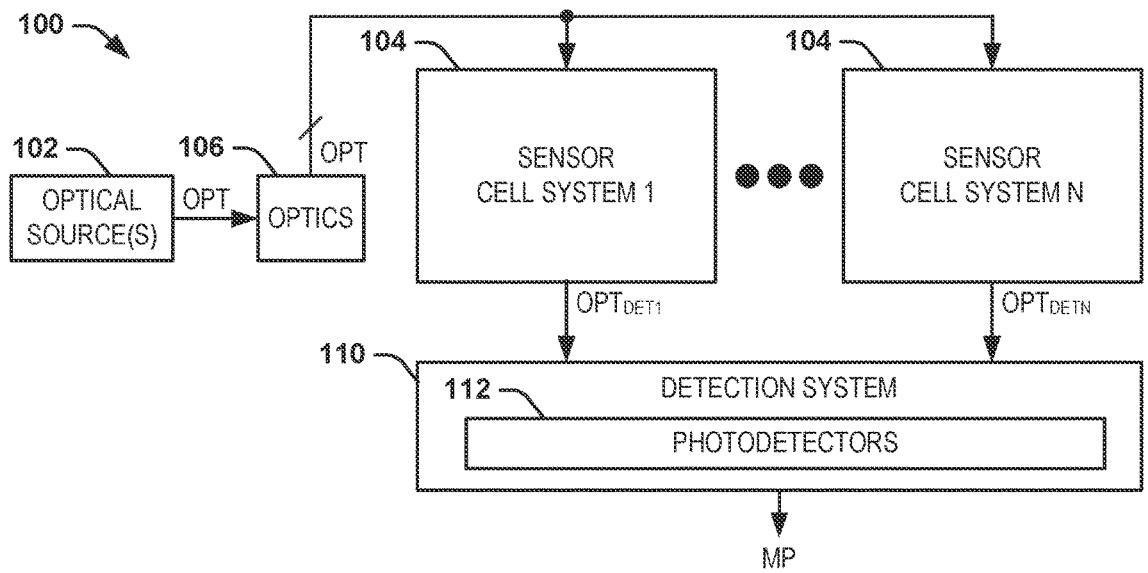
FIG. 1 illustrates an example block diagram of an atomic sensor system.

The present invention relates generally to sensor systems, and specifically to an atomic sensor system. The atomic sensor system can be implemented in any of a variety of applications that require very precise measurements, such as in an inertial navigation system (INS) for aerospace aviation. The atomic sensor system is configured to provide a very precise measurement of a measurable parameter of an external stimulus. The atomic sensor system can correspond to any of a variety of nuclear magnetic resonance (NMR) or electron paramagnetic resonance (EPR) sensors, such as a gyroscope or magnetometer, or any of a variety of other types of atomic sensors (e.g., electrometer or accelerometer). Therefore, the measurable parameter can correspond to measurement of rotation about one or more sensitive axes and/or scalar or vector measurements of an external magnetic field.

The atomic sensor system includes at least one optical source (e.g., laser(s)) and a plurality of sensor cell systems. The optical source(s) are configured to provide a respective at least one optical beam that are each provided to each of the sensor cell systems. As described herein, the term "sensor cell system" refers to a cell that is formed as a sensing media or encloses the sensing media in a volume therein. Such sensing media can thus be interactive with the at least one optical beam. As an example, the sensing media can be any of a variety of different type of polarizable spin systems. For example, the sensing media can correspond to vapors that can include any of alkali metal vapor (e.g., rubidium (Rb) or cesium (Cs)), gyromagnetic isotopes or other vapor that can exhibit spin, and/or buffer gases (e.g., nitrogen), such as based on the sensing application for the type of the sensor system and the parameter that is intended to be measured. As another example, the sensing media can include solid materials, such as can be optically probed for defect sensing, or can include any of a variety of liquids, plasma, or Bose-Einstein Condensate (BEC) that can be optically interactive, as well as additional ancillary materials to facilitate, modify, or improve optical interaction and/or sensing performance. As another example, the sensor cell systems can also include a magnetic field generator that is configured to generate a magnetic field (alternating current (AC) and/or direct current (DC)) in the volume therein.

As an example, the optical beam(s) can include a pump beam that is provided through each of the sensor cell systems, such as to facilitate precession of alkali metal atoms within based on the pump beam and the respective magnetic field. As another example, the optical beam(s) can include a probe beam that is provided through each of the sensor cell systems to be provided as a detection beam exiting each of the respective sensor cell systems. The detection beam can have an optical characteristic (e.g., Faraday rotation or amplitude) that is indicative of the measurable parameter. As yet another example, the optical beam(s) can correspond to a single optical beam that is provided to each of the sensor cell systems, and can implement the functions of both a pump beam and a probe beam. By providing the optical beam(s) to each of the sensor cell systems, such that each of the sensor cell systems shares the functions provided by the optical beam(s), a significantly more simplistic atomic sensor can be realized by reducing optical componentry.

The atomic sensor system also includes a detection system that is configured monitor the detection beam associated with each of the sensor cell systems. The detection system can include a plurality of photodetectors (e.g., photodiodes) that are configured to monitor the detection beam associated with each of the sensor cell systems. Therefore, the detection system can include a processor that is configured to determine the measurable parameter based on monitoring the optical characteristic associated with each of the detection beams. As another example, the detection system can include one or more additional photodetectors, such as a feedback photodetector to monitor an intensity of the optical beam(s) to control an optical characteristic (e.g., power) associated with the optical beam(s) in a feedback manner.

The arrangement of the sensor cell systems can be provided in the atomic sensor system in a variety of ways. As an example, the sensor cell systems can be arranged in a 1×N array, such that the arrangement of sensor cell systems is in-line to reduce a form-factor for a compact sensor package. As another example, the sensor cell systems can be arranged in a tetrahedral arrangement to provide for measurement of a gradient (e.g., a magnetic field gradient) across the three-dimensional arrangement of the sensor cell systems.

The quantity of the sensor cell systems can be provided in the atomic sensor system in a variety of ways, as well. For example, the atomic sensor system can include a pair of sensor cell systems that are arranged and oriented approximately the same. Therefore, one of the sensor cell systems can be redundant with respect to the other sensor cell system to facilitate calibration and/or to cancel bias errors (e.g., based on different scale-factors). As another example, the atomic sensor system can include three sensor cell systems that are arranged to provide for three orthogonal sensitive axes. Therefore, the atomic sensor system arranged as an NMR or EPR gyroscope can determine motion about three orthogonal axes, or the atomic sensor system arranged as an NMR or EPR magnetometer can determine vector three-dimensional vector components of the external magnetic field. One or more additional sensor cell systems can be included to provide redundancy for calibrating and/or error cancelation in the three-axis arrangement.

FIG. 1 illustrates an example block diagram of an atomic sensor system 100. The atomic sensor system 100 can be implemented in any of a variety of applications that require very precise measurements, such as in an INS for aerospace aviation. The atomic sensor system 100 is configured to provide a very precise measurement of a measurable parameter of an external stimulus. As an example, the atomic sensor system 100 can correspond to any of a variety of NMR or EPR sensors, such as a gyroscope, magnetometer, electrometer, accelerometer, clock, etc.

The atomic sensor system 100 includes at least one optical source 102 (e.g., laser(s) or optical fiber) and a plurality N of sensor cell systems 104, where N is greater than one. The optical source(s) 102 are configured to provide a respective at least one optical beam OPT that are each provided to each of the sensor cell systems 104 through a set of optics 106. As an example, the optical beam(s) can include a pump beam, a probe beam, and/or a combined pump/probe beam having appropriate frequencies and/or polarizations. As an example, the optics 106 can include an assortment of lenses, collimators, beamsplitters, mirrors, and/or a variety of other optical components to direct the optical beam(s) OPT to each of the sensor cell systems 104. Additionally, while the optical beam(s) OPT can propagate in free space, the optics 106 can include optical propagation media, such that optical beam(s) OPT can propagate in an optical fiber, a waveguide, and/or other optical coupling components (e.g., grating out-couplers, integrated turning mirrors, photonic wire bonding, etc.). For example, the atomic sensor system 100 can be implemented in a photonics integrated circuit (PIC) or a planar light-wave circuit that includes the optics 106 integrated therein.

The sensor cell systems 104 can each include sensing media enclosed in a volume therein. As an example, the sensing media can be optically interactive with the optical beam(s) OPT. As an example, each of the sensor cell systems 104 can include a magnetic field generator (not shown). The magnetic field generator can be configured to generate a magnetic field (alternating current (AC) and/or direct current (DC)) in the volume of the respective one of the sensor cell systems 104. As described herein, the direction of the magnetic field through the volume of the sensor cell system 104 can dictate a sensitive axis of the respective sensor cell system 104. For example, all of the sensor cell systems 104 can be fabricated approximately the same, and can be provided in the atomic sensor system 100 in different physical orientations with respect to each other to define different magnetic field directions, and therefore different sensitive axes. As an example and as described in greater detail herein, the different physical orientations may or may not be orthogonal to form a basis set for providing three-dimensional sensing of the measurable parameter.

As an example, the optical beam(s) OPT can include a pump beam that is provided through each of the sensor cell systems 104, such as to facilitate precession of alkali metal atoms provided as the sensing media within based on the pump beam and the respective magnetic field. As another example, the optical beam(s) OPT can include a probe beam that is provided through each of the sensor cell systems 104 to be provided as a detection beam exiting each of the respective sensor cell systems 104. In the example of FIG. 1, the detection beams are demonstrated as $OPT_{DET1}$ through $OPT_{DETN}$ corresponding respectively to the first through Nth sensor cell systems 104. The detection beams $OPT_{DET1}$ through $OPT_{DETN}$ can each have an optical characteristic (e.g., Faraday rotation or amplitude) that is indicative of the measurable parameter, as provided by the respective one of the sensor cell systems 104. As yet another example, the optical beam(s) OPT can correspond to a single optical beam that is provided to each of the sensor cell systems 104, and can implement the functions of both a pump beam and a probe beam. By providing the optical beam(s) OPT to each of the sensor cell systems 104, such that each of the sensor cell systems 104 shares the functions provided by the optical beam(s) OPT, a significantly more simplistic atomic sensor can be realized by reducing optical componentry, as described in greater detail herein.

In the example of FIG. 1, the atomic sensor system 100 also includes a detection system 110 that is configured to determine the measurable parameter, demonstrated as a signal MP. The detection system 110 includes a plurality of photodetectors (e.g., photodiodes) 112 that are configured to monitor the detection beams $OPT_{DET1}$ through $OPT_{DETN}$ associated with the respective sensor cell systems 104. Therefore, the detection system 110 can include a processor that is configured to determine the measurable parameter MP based on monitoring the optical characteristic associated with each of the detection beams $OPT_{DET1}$ through $OPT_{DETN}$. As another example, the detection system can include one or more additional photodetectors 112, such as a feedback photodetector to monitor an intensity of the optical beam(s) OPT to control an optical characteristic (e.g., power) associated with the optical beam(s) OPT in a feedback manner.

The arrangement of the atomic sensor system 100 is not limited to the example of FIG. 1 or the following examples described herein. For example, additional components can be implemented in the atomic sensor system 100. As an example, the atomic sensor system 100 can include heating elements, such as to maintain the vapor pressure of the sensing media (e.g., alkali metal atoms) in the sensor cell systems 104, as well as temperature monitoring systems for the sensor cell systems 104. Therefore, the heating elements and the temperature monitoring systems can cooperate to maintain a consistent temperature in the volume of the sensor cell systems 104 to provide for proper operation of the atomic sensor system 100. For example, the heating elements and/or temperature monitors can be implemented as part of the atomic sensor system 100 or can be local to each of the sensor cell systems 104. As yet another example, the atomic sensor system 100 can include magnetic shielding components to avoid magnetic field noise and/or crosstalk between the sensor cell systems 104, as well as to suppress external magnetic fields. As an example, the magnetic shielding components can be deposited on substrate materials within the sensor cell systems 104, or can be arranged external to and between the sensor cell systems 104. For example, the magnetic shielding materials can include any of a variety of shielding materials (e.g., a high-µ material).

As described herein, the arrangement of the sensor cell systems 104 can be provided in the atomic sensor system 100 in a variety of ways. As an example, the sensor cell systems 104 can be arranged in a 1×N array, such that the arrangement of sensor cell systems 104 is in-line to reduce a form-factor for a compact sensor package. In this example, the optical beam(s) OPT can be provided along the array parallel to the in-line arrangement of the sensor cell systems 104, with the optics 106 being configured to tap a portion of each of the optical beam(s) OPT to each of the sensor cell systems 104 along the in-line arrangement of the array. As another example, the sensor cell systems 104 can be arranged in a tetrahedral arrangement to provide for measurement of a gradient (e.g., a magnetic field gradient) across the three-dimensional arrangement of the sensor cell systems 104.

The quantity of the sensor cell systems 104 can be provided in the atomic sensor system 100 in a variety of ways, as well. For example, the atomic sensor system 100 can include a pair of sensor cell systems 104 that are arranged and oriented approximately the same. Therefore, one of the sensor cell systems 104 can be redundant with respect to the other sensor cell system to facilitate calibration and/or to cancel bias errors (e.g., based on different scale-factors). As another example, the atomic sensor system 100 can include three sensor cell systems 104 that are arranged to provide for three orthogonal sensitive axes. Therefore, the atomic sensor system 100 arranged as an atomic gyroscope can determine motion about three orthogonal axes, or the atomic sensor system 100 arranged as an atomic magnetometer can determine vector three-dimensional vector components of the external magnetic field. One or more additional sensor cell systems 104 can be included to provide redundancy for calibrating and/or error cancelation in the three-axis arrangement. Therefore, the atomic sensor system 100 can be arranged in a variety of ways to implement determination of the measurable parameter MP in a variety of ways.

Figure 2:
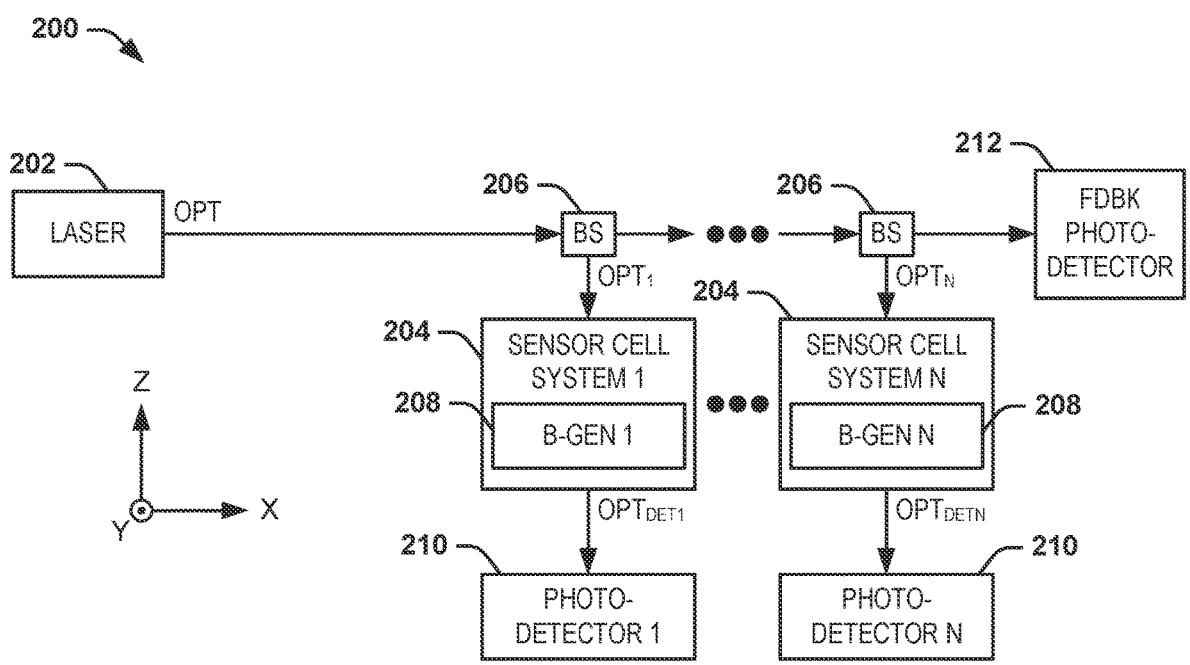
FIG. 2 illustrates an example of an atomic sensor system.

FIG. 2 illustrates an example of an atomic sensor system 200. As an example, the atomic sensor system 200 can correspond to any of a variety of atomic sensors, such as a gyroscope or magnetometer. The atomic sensor system 200 can correspond to the atomic sensor system 100 in the example of FIG. 1. Therefore, reference is to be made to the example of FIG. 1 in the following description of the example of FIG. 2.

The atomic sensor system 200 includes a laser 202 and a plurality N of sensor cell systems 204, where N is greater than one. The laser 202 is configured to provide a respective an optical beam OPT that is provided to each of the sensor cell systems 204 (e.g. through the optics 106). In the example of FIG. 2, the sensor cell systems 204 are arranged in a 1×N array, such that the arrangement of sensor cell systems 204 is in-line along the X-axis to reduce a form-factor for a compact sensor package. Thus, the optical beam OPT is provided along the X-axis parallel to the in-line arrangement of the sensor cell systems 204. The optical beam OPT is provided to each of the sensor cell systems 204 via a beamsplitter ("BS") 206 that can be arranged as part of the optics. In the example of FIG. 2, the separate portions of the optical beam OPT are provided as $OPT_1$ through $OPT_N$ to each of the respective first through Nth sensor cell systems 204. The beamsplitter 206 can be configured as a partially silvered mirror or can be arranged as a polarization beamsplitter, such that the optics can include polarizers (e.g., a half-wave plate) in the optical path of the optical beam OPT.

Therefore, the optical beams $OPT_1$ through $OPT_N$ can interact with the sensing media enclosed in a volume within each of the sensor cell systems 204. In the example of FIG. 2, each of the sensor cell systems 204 includes a magnetic field generator ("B-GEN 1" through "B-GEN N") 208. The magnetic field generator 208 is configured to generate a magnetic field (alternating current (AC) and/or direct current (DC)) in the volume of the respective one of the sensor cell systems 204. As described herein, the direction of the magnetic field through the volume of the sensor cell system 204 can dictate a sensitive axis of the respective sensor cell system 204.

As an example, the optical beams $OPT_1$ through $OPT_N$ can be configured to provide the functions of both a pump beam and a probe beam. For example, the optical beams $OPT_1$ through $OPT_N$ can be provided through each of the sensor cell systems 204 to facilitate precession of alkali metal atoms provided as the sensing media within based on respective magnetic field. The optical beams $OPT_1$ through $OPT_N$ can also be provided as respective detection beams exiting each of the respective sensor cell systems 204. In the example of FIG. 2, the detection beams are demonstrated as $OPT_{DET1}$ through $OPT_{DETN}$ corresponding respectively to the first through Nth sensor cell systems 204. The detection beams $OPT_{DET1}$ through $OPT_{DETN}$ can each have an optical characteristic (e.g., Faraday rotation or amplitude) that is indicative of the measurable parameter, as provided by the respective one of the sensor cell systems 204. By providing the optical beam OPT to each of the sensor cell systems 204, such that each of the sensor cell systems 204 shares the pump and probe beam functionality provided by the optical beam OPT, a significantly more simplistic atomic sensor can be realized by reducing optical componentry. Particularly, the associated bill of materials and form-factor of the atomic sensor system 200 can be significantly reduced relative to other atomic sensors that include multiple sensor cell systems.

In the example of FIG. 2, the atomic sensor system 200 includes a plurality N of photodetectors (e.g., photodiodes) 210 that are configured to monitor the detection beams $OPT_{DET1}$ through $OPT_{DETN}$ associated with the respective sensor cell systems 204. The photodetectors 210 can be implemented in a detection system (e.g., the detection system 110) that can include a processor configured to determine the measurable parameter based on monitoring the optical characteristic associated with each of the detection beams $OPT_{DET1}$ through $OPT_{DETN}$. Additionally, in the example of FIG. 2, the atomic sensor system 200 includes a feedback photodetector ("FDBK PHOTODETECTOR") 212 that is configured to monitor an optical characteristic of the optical beam OPT. For example, the feedback photodetector 212 can monitor the intensity of the optical beam OPT to control the power associated with the optical beam OPT in a feedback manner.

As described above, the quantity N of the sensor cell systems 204 can be provided in the atomic sensor system 200 in a variety of ways. For example, the atomic sensor system 200 can include a pair of sensor cell systems 204 that are arranged and oriented approximately the same for redundancy to facilitate calibration and/or to cancel bias errors. As another example, the atomic sensor system 200 can include three sensor cell systems 204 that are arranged to provide for three orthogonal sensitive axes. Therefore, the atomic sensor system 200 arranged as an atomic gyroscope can determine motion about three orthogonal axes, or the atomic sensor system 200 arranged as an atomic magnetometer can determine vector three-dimensional vector components of the external magnetic field. One or more additional sensor cell systems 204 can be included to provide redundancy for calibrating and/or error cancelation in the three-axis arrangement. Therefore, the atomic sensor system 200 can be arranged in a variety of ways to implement determination of the measurable parameter MP in a variety of ways.

Figure 3:
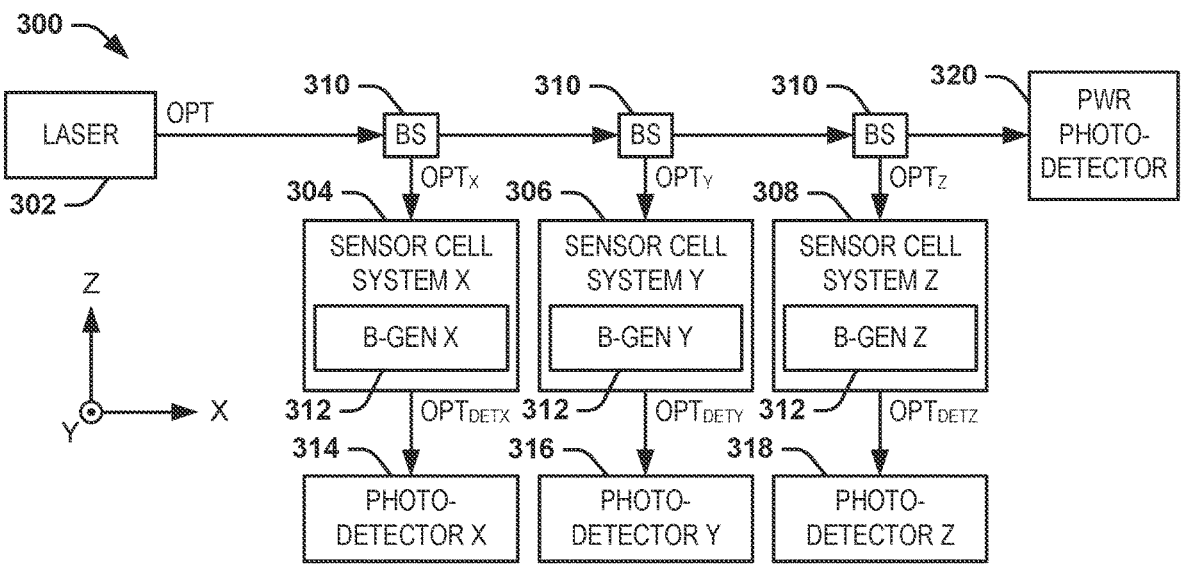
FIG. 3 illustrates an example of an atomic gyroscope system.

FIG. 3 illustrates an example of an atomic gyroscope system 300. The atomic gyroscope system 300 is therefore configured to determine rotation about three orthogonal axes in three-dimensional space, as described in greater detail herein. As an example, the atomic gyroscope system 300 can be arranged as an NMR or EPR gyroscope. The atomic gyroscope system 300 can correspond to the atomic sensor system 100 in the example of FIG. 1. Therefore, reference is to be made to the example of FIG. 1 in the following description of the example of FIG. 3.

The atomic gyroscope system 300 includes a laser 302, a first sensor cell system 304 ("SENSOR CELL SYSTEM X"), a second sensor cell system 306 ("SENSOR CELL SYSTEM Y"), and a third sensor cell system 308 ("SENSOR CELL SYSTEM Z"). The first sensor cell system 304 is associated with determining rotation about an X-axis, the second sensor cell system 306 is associated with determining rotation about a Y-axis, and the third sensor cell system 308 is associated with determining rotation about a Z-axis, with the X, Y, and Z axes being orthogonal with respect to each other. While the example of FIG. 3 demonstrates three sensor cell systems, one or more additional sensor cell systems can also be included. For example, an additional redundant sensor cell system can be provided for calibration or for error correction. As another example, the atomic gyroscope system 300 can include three additional redundant sensor cell systems, one for each of the X, Y, and Z axes, to provide calibration or error correction.

The laser 302 is configured to generate an optical beam OPT that is provided to each of the sensor cell systems 304, 306, and 308 (e.g. through the optics 106). In the example of FIG. 3, the sensor cell systems 304, 306, and 308 are arranged in a 1×3 array, such that the arrangement of sensor cell systems 304, 306, and 308 is in-line along the X-axis to reduce a form-factor for a compact sensor package. Thus, the optical beam OPT is provided along the X-axis parallel to the in-line arrangement of the sensor cell systems 304, 306, and 308. The optical beam OPT is provided to each of the sensor cell systems 304, 306, and 308 via a beamsplitter 310 that can be arranged as part of the optics. In the example of FIG. 3, the separate portions of the optical beam OPT are provided as $OPT_X$, $OPT_Y$, and $OPT_Z$ to each of the respective first, second, and third sensor cell systems 304, 306, and 308. The beamsplitter 310 can be configured as a partially silvered mirror or can be arranged as a polarization beamsplitter, such that the optics can include polarizers (e.g., a half-wave plate) in the optical path of the optical beam OPT.

Therefore, the optical beams $OPT_X$, $OPT_Y$, and $OPT_Z$ can interact with the sensing media enclosed in a volume within each of the sensor cell systems 304, 306, and 308. In the example of FIG. 3, each of the sensor cell systems 304, 306, and 308 includes a magnetic field generator ("B-GEN X", "B-GEN Y", and "B-GEN Z") 312. The magnetic field generator 312 is configured to generate a magnetic field (alternating current (AC) and/or direct current (DC)) in the volume of the respective one of the sensor cell systems 304, 306, and 308. As described herein, the direction of the magnetic field through the volume of the sensor cell systems 304, 306, and 308 can dictate a sensitive axis of the respective sensor cell systems 304, 306, and 308. For example, the different physical orientations of the sensor cell systems 304, as well as the respective directions of the magnetic fields through the volume of the respective sensor cell systems 304, 306, and 308, may or may not be orthogonal to form a basis set for providing three-dimensional sensing of the measurable parameter.

As an example, the optical beams $OPT_X$, $OPT_Y$, and $OPT_Z$ can be configured to provide the functions of both a pump beam and a probe beam. For example, the optical beams $OPT_X$, $OPT_Y$, and $OPT_Z$ can be provided through each of the sensor cell systems 304, 306, and 308 to facilitate precession of alkali metal atoms provided as the sensing media within based on respective magnetic field. The optical beams $OPT_X$, $OPT_Y$, and $OPT_Z$ can also be provided as respective detection beams exiting each of the respective sensor cell systems 304, 306, and 308. In the example of FIG. 3, the detection beams are demonstrated as $OPT_{DETX}$, $OPT_{DETY}$, and $OPT_{DETZ}$ corresponding respectively to the first, second, and third sensor cell systems 304, 306, and 308. The detection beams $OPT_{DETX}$, $OPT_{DETY}$, and $OPT_{DETZ}$ can each have an optical characteristic (e.g., Faraday rotation or amplitude) that is indicative of the rotation of the atomic gyroscope system 300 about the X-axis as provided by the sensor cell system 304, about the Y-axis as provided by the sensor cell system 306, and about the Z-axis as provided by the sensor cell system 308, respectively.

In the example of FIG. 3, the atomic gyroscope system 300 includes a first photodetector (e.g., photodiode) 314 that is configured to monitor the detection beam $OPT_{DETX}$, a second photodetector 316 that is configured to monitor the detection beam $OPT_{DETY}$, and a third photodetector 318 that is configured to monitor the detection beam $OPT_{DETZ}$. The photodetectors 314, 316, and 318 can be implemented in a detection system (e.g., the detection system 110) that can include a processor configured to determine the rotation of the atomic gyroscope system 300 based on monitoring the optical characteristic associated with each of the detection beams $OPT_{DETX}$, $OPT_{DETY}$, and $OPT_{DETZ}$. Additionally, in the example of FIG. 3, the atomic gyroscope system 300 includes a feedback photodetector 320 that is configured to monitor an optical characteristic of the optical beam OPT. For example, the feedback photodetector 320 can monitor the intensity of the optical beam OPT to control the power associated with the optical beam OPT in a feedback manner.

Figure 4:
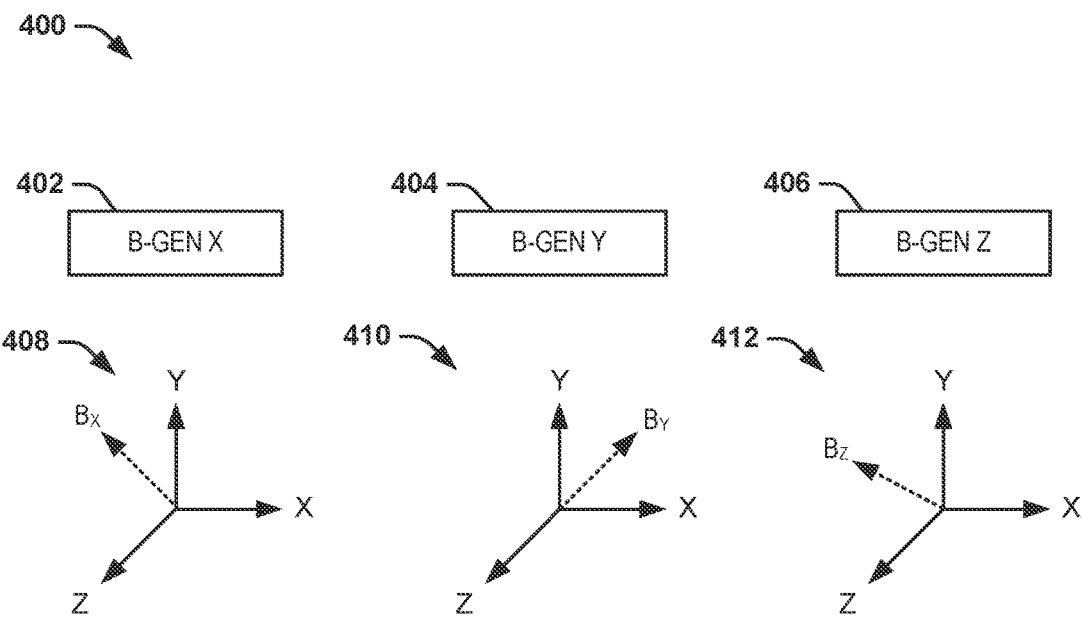
FIG. 4 illustrates an example diagram of magnetic fields.

FIG. 4 illustrates an example diagram 400 of magnetic fields. The diagram 400 demonstrates a first magnetic field generator ("B-FIELD GENERATOR") 402, a second magnetic field generator 404, and a third magnetic field generator 406. The diagram 400 also demonstrates a first Cartesian coordinate system 408, a second Cartesian coordinate system 410, and a third Cartesian coordinate system 412. The Cartesian coordinate systems 408, 410, and 412 are not necessarily aligned to the Cartesian coordinate system demonstrated in the example of FIG. 3. Each of the magnetic field generators 402, 404, and 406 can correspond to the magnetic field generators 312 of the respective sensor cell systems 304, 306, and 308 in the example of FIG. 3. Therefore, reference is to be made to the example of FIG. 3 in the following description of the example of FIG. 4.

The first Cartesian coordinate system 408 can correspond to the first magnetic field generator 402. The first magnetic field generator 402 can have coils that are oriented in a manner to provide a magnetic field $B_X$ (e.g., in response to an AC and/or DC current). The magnetic field $B_X$ is demonstrated as being directed in the XY-plane, and thus having vector components both the –X-axis and the +Y-axis. Similarly, the second Cartesian coordinate system 410 can correspond to the second magnetic field generator 404. The second magnetic field generator 404 can have coils that are oriented in a manner to provide a magnetic field $B_Y$ (e.g., in response to an AC and/or DC current). The magnetic field $B_Y$ is also demonstrated as also being directed in the XY-plane, but instead includes vector components in the +X-axis and the +Y-axis.

The third Cartesian coordinate system 412 can correspond to the third magnetic field generator 406. The third magnetic field generator 406 can have coils that are oriented in a manner to provide a magnetic field $B_Z$ (e.g., in response to an AC and/or DC current). The magnetic field $B_Z$ is demonstrated as being directed in the YZ-plane, having vector components in the +Y-axis and the +Z-axis. Therefore, in the example of FIG. 4, the magnetic field $B_Z$ is non-orthogonal with respect to the magnetic fields $B_X$ and $B_Y$. As an example, the detection system 110 can be programmed to determine the rotation or magnetic field component in the Z axis (orthogonal to the X-axis and the Y-axis) based on the non-orthogonal sensitive axis of the magnetic field $B_Z$. Such an arrangement can provide for a simpler design with respect to parallel optical beams $OPT_X$, $OPT_Y$, and $OPT_Z$, and therefore parallel detection beams $OPT_{DETX}$, $OPT_{DETY}$, and $OPT_{DETZ}$.

The arrangement of the magnetic fields $B_X$, $B_Y$, and $B_Z$ can dictate the sensitive axes of each of the sensor cell systems 304, 306, and 308. Based on the magnetic field vector of the magnetic field $B_X$, the optical beam $OPT_X$ can be provided as the dual function of pump beam and probe beam. Additionally, the detection system (e.g., the detection system 110) can determine rotation about the X-axis based on the optical characteristic of the detection beam $OPT_{DETX}$ based on identifying changes to the sensing media with respect to the X-axis. Similarly, based on the magnetic field vector of the magnetic field $B_Y$, the optical beam $OPT_Y$ can be provided as the dual function of pump beam and probe beam. Additionally, the detection system can determine rotation about the Y-axis based on the optical characteristic of the detection beam $OPT_{DETY}$ based on identifying changes to the precession of the sensing media with respect to the Y-axis. Similarly, based on the magnetic field vector of the magnetic field $B_Z$, the optical beam $OPT_Z$ can be provided as the dual function of pump beam and probe beam. Additionally, the detection system can determine rotation about the Z-axis based on the optical characteristic of the detection beam $OPT_{DETZ}$ based on identifying changes to the precession of the sensing media with respect to the Z-axis.

Referring to the example of FIG. 3, the sensor cell systems 304, 306, and 308 can be fabricated approximately the same. In this example, the sensor cell systems 304, 306, and 308 can be physically oriented in different ways relative to each other to provide the different magnetic field vectors of the magnetic fields $B_X$, $B_Y$, and $B_Z$.

Figure 5:
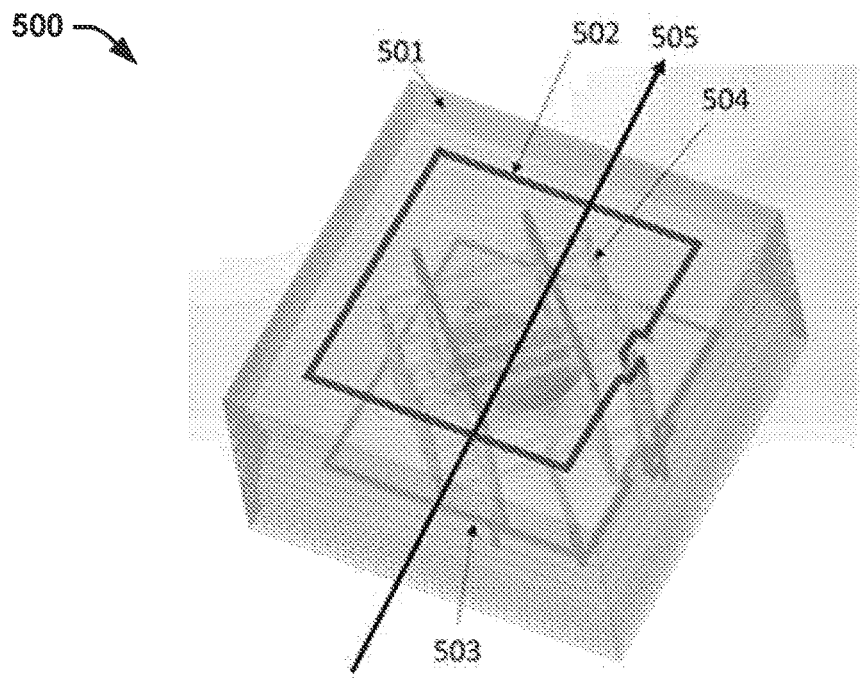
FIG. 5 illustrates an example of a sensor cell system.

FIG. 5 illustrates an example of a sensor cell system 500. The sensor cell system 500 can correspond to the each of the sensor cell systems 304, 306, and 308. Therefore, reference is to be made to the example of FIGS. 3 and 4 in the following description of the example of FIG. 5.

The sensor cell system 500 is demonstrated in a perspective view. The sensor cell system 500 includes a housing 501 that is demonstrated in the example of FIG. 5 as substantially transparent to provide a view of the interior and to facilitate propagation of the optical beam, demonstrated at 505, through the walls of the sensor cell system 500. The transparency of the housing 501 depicted in the example of FIG. 5 for ease of demonstration, such that the housing 501 can only be transparent with respect to a given wavelength or band of the optical beam 505. Alternatively, the housing 501 can include one or more transparent windows through which the optical beam 505 can propagate. Therefore, the optical beam 505 can interact with the sensing media enclosed therein. The sensor cell system 500 includes a primary coil 504 that is oriented at an angle within the volume of the sensor cell system 500. The primary coil 504 can correspond to the magnetic field generator 312, and therefore generate a magnetic field at an angle that is offset relative to the orthogonal walls of the sensor cell system 500.

The sensor cell system 500 also includes secondary coils 502 and 503 that can provide additional magnetic fields. For example, the secondary coils 502 and 503 can be oriented in a variety of different vectors in the sensor cell 500 (e.g., parallel with, perpendicular to, or skewed with respect to the primary coil 504) to provide a respective variety of secondary magnetic field directions. As an example, the secondary coils 502 and 503 can provide magnetic field adjustment in a feedback manner to accommodate internal or external perturbations associated with the respective magnetic field generator in the sensor cell system 500 (e.g., the respective one of the magnetic field generators 402, 404, and 406 in the example of FIG. 4). For example, the secondary coils 502 and 503 can provide magnetic fields to modify the vector directions of the respective one of the magnetic fields $B_X$, $B_Y$, and $B_Z$ that the magnetic field generator of the sensor cell system 500 is configured to provide. Therefore, the respective one of the magnetic fields $B_X$, $B_Y$, and $B_Z$ can be corrected in a feedback manner and/or adjusted to change the vector of the respective one of the magnetic fields $B_X$, $B_Y$, and $B_Z$. As another example, the secondary coils 502 and 503 can provide AC magnetic fields, such as to facilitate precession of alkali metal vapor provided as the sensing media in the sensor cell 500. Accordingly, the secondary coils 502 and 503 can provide a variety of different functions for providing secondary AC and/or DC magnetic fields within the volume of the sensor cell 500.

Figure 6:
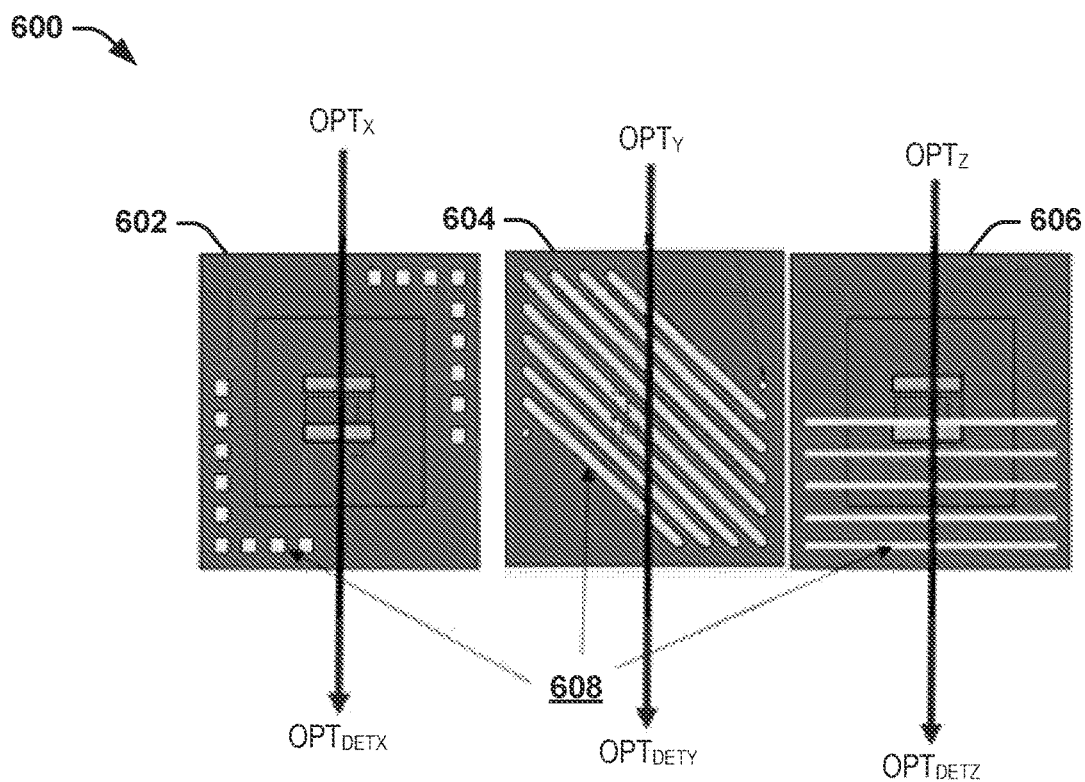
FIG. 6 illustrates an example of a three-axis sensor cell arrangement.

FIG. 6 illustrates an example of a three-axis sensor cell arrangement 600. The three-axis sensor cell arrangement 600 includes a first sensor cell system 602, a second sensor cell system 604, and a third sensor cell system 606. As an example, each of the sensor cell systems 602, 604, and 606 can be fabricated approximately the same, and can each correspond to the sensor cell system 500. Each of the sensor cell systems 602, 604, and 606 includes a primary coil 608 that is oriented at an angle within the volume of the respective sensor cell systems 602, 604, and 606. Therefore, reference is to be made to the example of FIGS. 3-5 in the following description of the example of FIG. 6.

The first sensor cell system 602 can correspond to the sensor cell system 306 in the example of FIG. 3, and can therefore be configured to determine rotation about the Y-axis. Thus, the magnetic field generator of the first sensor cell system 602 can be configured to provide the magnetic field vector $B_Y$. As a result, the detection beam $OPT_{DETY}$ corresponding to the optical beam $OPT_Y$ can be monitored by the photodetector 316 of the detection system (e.g., the detection system 110) to determine a change in the optical characteristic (e.g., Faraday rotation or amplitude) corresponding to rotation about the Y-axis.

The second sensor cell system 604 is demonstrated as rotated 180° about the propagation path of the respective optical beams relative to the first sensor cell system 602. The second sensor cell system 604 can correspond to the sensor cell system 304 in the example of FIG. 3, and can therefore be configured to determine rotation about the X-axis. Thus, the magnetic field generator of the second sensor cell system 604 can be configured to provide the magnetic field vector $B_X$. As a result, the detection beam $OPT_{DETX}$ corresponding to the optical beam $OPT_X$ can be monitored by the photodetector 314 of the detection system (e.g., the detection system 110) to determine a change in the optical characteristic (e.g., Faraday rotation or amplitude) corresponding to rotation about the X-axis.

The third sensor cell system 606 is demonstrated as rotated about two-orthogonal axes relative to the first sensor cell system 602 and the second sensor cell system 602. The third sensor cell system 606 can correspond to the sensor cell system 308 in the example of FIG. 3, and can therefore be configured to determine rotation about the Z-axis. Thus, the magnetic field generator of the third sensor cell system 606 can be configured to provide the magnetic field vector $B_Z$. As a result, the detection beam $OPT_{DETZ}$ corresponding to the optical beam $OPT_Z$ can be monitored by the photodetector 318 of the detection system (e.g., the detection system 110) to determine a change in the optical characteristic (e.g., Faraday rotation or amplitude) corresponding to rotation about the Z-axis. Based on the rotation of the third sensor cell 606 about the two-orthogonal axes relative to the first sensor cell system 602 and the second sensor cell system 602, the third sensor cell 606 can provide the magnetic field vector $B_Z$ as non-orthogonal with respect to the magnetic field vector $B_X$ and the magnetic field vector $B_Y$, similar to as described above in the example of FIG. 4 As such, the associated detection system (e.g., the detection system 110) can implement a simpler design for determining rotation or magnetic field about three orthogonal axes based on parallel optical beams $OPT_X$, $OPT_Y$, and $OPT_Z$, and therefore parallel detection beams $OPT_X$, $OPT_Y$, and $OPT_Z$.

By implementing the sensor cell systems 602, 604, and 606 as approximately identical sensor cell systems and manipulating the magnetic field vectors merely by physically orienting the sensor cell systems 602, 604, and 606 relative to each other, the fabrication of an associated atomic sensor system can be provided in a much more simplistic manner.

Figure 7:
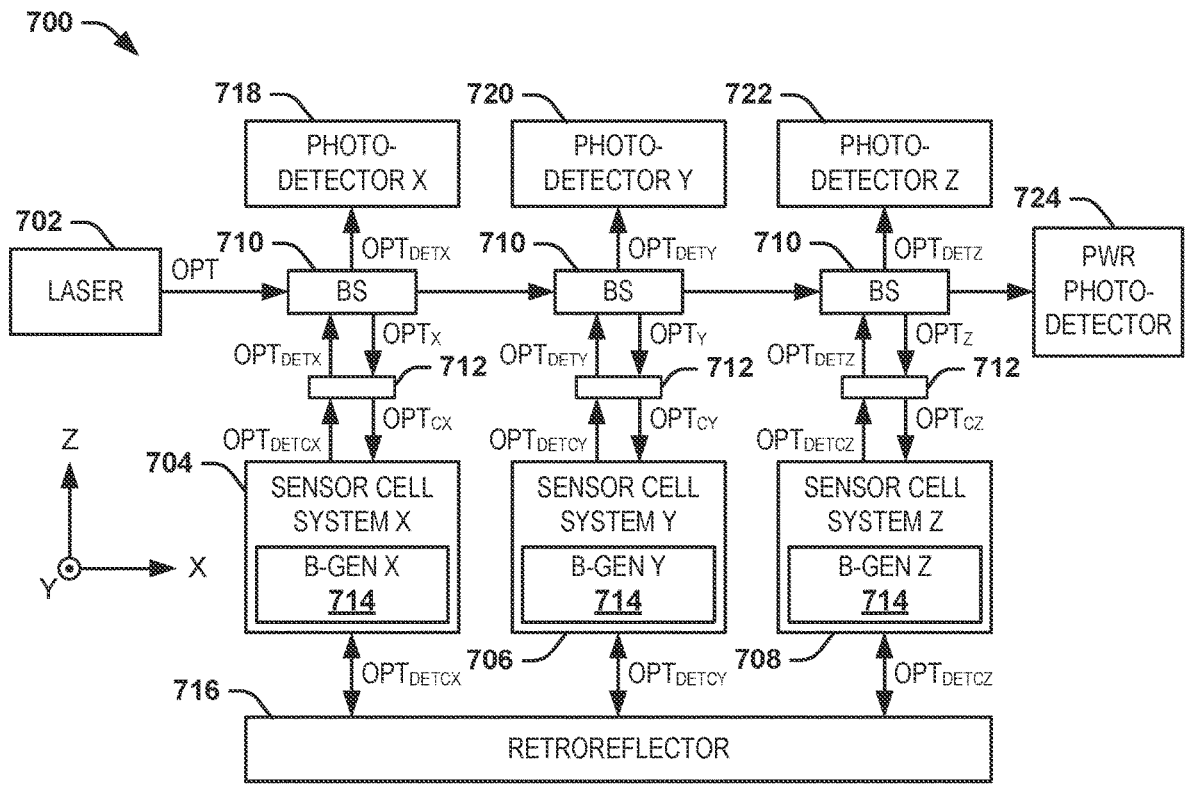
FIG. 7 illustrates an example of an atomic magnetometer system.

FIG. 7 illustrates an example of an atomic magnetometer system 700. The atomic magnetometer system 700 is configured to determine a vector and intensity measurement of an external magnetic field in three-dimensional space, as described in greater detail herein. As an example, the atomic magnetometer system 700 can be arranged as an NMR or EPR magnetometer. The atomic magnetometer system 700 can correspond to the atomic sensor system 100 in the example of FIG. 1. Therefore, reference is to be made to the example of FIG. 1 in the following description of the example of FIG. 7.

The atomic magnetometer system 700 includes a laser 702, a first sensor cell system 704 ("SENSOR CELL SYS- TEM X"), a second sensor cell system 706 ("SENSOR CELL SYSTEM Y"), and a third sensor cell system 708 ("SENSOR CELL SYSTEM Z"). As an example, the sensor cell systems 704, 706, and 708 can each correspond to the sensor cell system 500 in the example of FIG. 5. Therefore, each of the sensor cell systems 704, 706, and 708 can be fabricated approximately identically, as described above. The first sensor cell system 704 is associated with determining an X-axis component of the external magnetic field, the second sensor cell system 706 is associated with determining a Y-axis component of the external magnetic field, and the third sensor cell system 708 is associated with determining a Z-axis component of the external magnetic field, with the X, Y, and Z axes being orthogonal with respect to each other. While the example of FIG. 7 demonstrates three sensor cell systems, one or more additional sensor cell systems can also be included. For example, an additional redundant sensor cell system can be provided for calibration or for error correction. As another example, the atomic gyroscope system 300 can include three additional redundant sensor cell systems, one for each of the X, Y, and Z axes, to provide calibration or error correction.

The laser 702 is configured to generate an optical beam OPT that is provided to each of the sensor cell systems 704, 706, and 708 (e.g. through the optics 106). In the example of FIG. 7, the sensor cell systems 704, 706, and 708 are arranged in a 1×3 array, such that the arrangement of sensor cell systems 704, 706, and 708 is in-line along the X-axis to reduce a form-factor for a compact sensor package. Thus, the optical beam OPT is provided along the X-axis parallel to the in-line arrangement of the sensor cell systems 704, 706, and 708. The optical beam OPT is provided is split via a beamsplitter 710 that can be arranged as part of the optics to provide optical beams $OPT_X$, $OPT_Y$, and $OPT_Z$. The beamsplitter 710 can be configured as a partially silvered mirror or can be arranged as a polarization beamsplitter, such that the optics can include polarizers (e.g., a half-wave plate) in the optical path of the optical beam OPT.

In the example of FIG. 7, each of the optical beams $OPT_X$, $OPT_Y$, and $OPT_Z$ are provided through a quarter-wave plate 712 that is arranged between the beamsplitters 710 and the respective sensor cell systems 704, 706, and 708. Therefore, the optical beams $OPT_X$, $OPT_Y$, and $OPT_Z$ are circularly-polarized to provide optical beams $OPT_{CX}$, $OPT_{CY}$, and $OPT_{CZ}$ that are provided to the sensor cell systems 704, 706, and 708. Therefore, the optical beams $OPT_{CX}$, $OPT_{CY}$, and $OPT_{CZ}$ can interact with the sensing media enclosed in a volume within each of the sensor cell systems 704, 706, and 708. In the example of FIG. 7, each of the sensor cell systems 704, 706, and 708 includes a magnetic field generator ("B-FIELD GENERATOR") 714. The magnetic field generator 714 is configured to generate a magnetic field (alternating current (AC) and/or direct current (DC)) in the volume of the respective one of the sensor cell systems 704, 706, and 708. As described herein, the direction of the magnetic field through the volume of the sensor cell systems 704, 706, and 708 can dictate a sensitive axis of the respective sensor cell systems 704, 706, and 708, similar to as described above in the example of FIG. 4.

As an example, the optical beams $OPT_{CX}$, $OPT_{CY}$, and $OPT_{CZ}$ can be configured to provide the functions of both a pump beam and a probe beam. For example, the optical beams $OPT_{CX}$, $OPT_{CY}$, and $OPT_{CZ}$ can be provided through each of the sensor cell systems 704, 706, and 708 along the −Y-axis to facilitate precession of alkali metal atoms provided as the sensing media within based on respective magnetic field. In the example of FIG. 7, the atomic magnetometer system 700 includes a retroreflector 716 that is configured to reflect the optical beams $OPT_{CX}$, $OPT_{CY}$, and $OPT_{CZ}$ back through the respective sensor cell systems 704, 706, and 708 along the +Y-axis. While the retroreflector 716 is demonstrated as a singular retroreflector, multiple retroreflectors 716, one for each of the optical beams $OPT_{CX}$, $OPT_{CY}$, and $OPT_{CZ}$, can instead be implemented. The optical beams $OPT_{CX}$, $OPT_{CY}$, and $OPT_{CZ}$ are thus provided in a propagation direction that is collinear with the optical beams $OPT_{CX}$, $OPT_{CY}$, and $OPT_{CZ}$ provided along the −Y-axis through the respective sensor cell systems 704, 706, and 708. The optical beams $OPT_{CX}$, $OPT_{CY}$, and $OPT_{CZ}$ provided along the +Y-axis have a circular-polarization that is an opposite orientation of the collinear respective optical beams $OPT_{CX}$, $OPT_{CY}$, and $OPT_{CZ}$ provided along the −Y-axis.

The optical beams $OPT_{CX}$, $OPT_{CY}$, and $OPT_{CZ}$ provided along the +Y-axis exit the respective sensor cell systems 704, 706, and 708 as respective circularly-polarized detection beams exiting each of the respective sensor cell systems 704, 706, and 708. In the example of FIG. 7, the detection beams are demonstrated as $OPT_{DETCX}$, $OPT_{DETCY}$, and $OPT_{DETCZ}$ corresponding respectively to the first, second, and third sensor cell systems 704, 706, and 708. The circularly-polarized detection beams $OPT_{DETCX}$, $OPT_{DETCY}$, and $OPT_{DETCZ}$ can each have an optical characteristic (e.g., Faraday rotation or amplitude) that is indicative of the vector component of the external magnetic field of the atomic magnetometer system 700 relative to the X-axis as provided by the sensor cell system 304, relative to the Y-axis as provided by the sensor cell system 306, and relative to the Z-axis as provided by the sensor cell system 308, respectively.

The circularly-polarized detection beams $OPT_{DETCX}$, $OPT_{DETCY}$, and $OPT_{DETCZ}$ are each provided to the quarter-wave plates 712. The quarter-wave plates 712 therefore convert the circularly-polarized detection beams $OPT_{DETCX}$, $OPT_{DETCY}$, and $OPT_{DETCZ}$ to linearly-polarized detection beams $OPT_{DETX}$, $OPT_{DETY}$, and $OPT_{DETZ}$. In the example of FIG. 7, the atomic magnetometer system 700 includes a first photodetector (e.g., photodiode) 718 that is configured to monitor the detection beam $OPT_{DETX}$, a second photodetector 720 that is configured to monitor the detection beam $OPT_{DETY}$, and a third photodetector 722 that is configured to monitor the detection beam $OPT_{DETZ}$. The photodetectors 718, 720, and 722 can be implemented in a detection system (e.g., the detection system 110) that can include a processor configured to determine the intensity and vector direction external magnetic field based on monitoring the optical characteristic associated with each of the detection beams $OPT_{DETX}$, $OPT_{DETY}$, and $OPT_{DETZ}$. Additionally, similar to as described above in the example of FIG. 3, the atomic magnetometer system 700 includes a feedback photodetector 724 that is configured to monitor an optical characteristic of the optical beam OPT. For example, the feedback photodetector 724 can monitor the intensity of the optical beam OPT to control the power associated with the optical beam OPT in a feedback manner.

Figure 8:
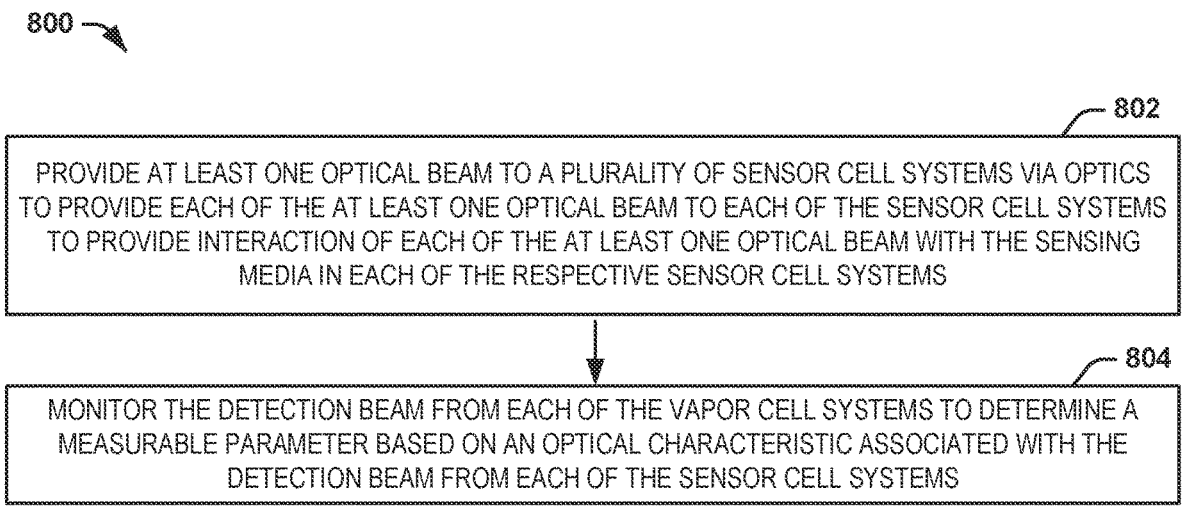
FIG. 8 illustrates an example of a method for determining a measurable parameter in an atomic sensor system.

In view of the foregoing structural and functional features described above, methods in accordance with various aspects of the present disclosure will be better appreciated with reference to FIG. 8. While, for purposes of simplicity of explanation, the method of FIG. 8 is shown and described as executing serially, it is to be understood and appreciated that the present disclosure is not limited by the illustrated orders, as some aspects could, in accordance with the present disclosure, occur in different orders and/or concurrently with other aspects from that shown and described herein. Moreover, not all illustrated features may be required to implement method in accordance with an aspect of the present disclosure.

FIG. 8 illustrates an example of a method 800 for determining a measurable parameter in an atomic sensor system (e.g., the atomic sensor system 100). At 802, at least one optical beam (e.g., the optical beam OPT) is provided to a plurality of sensor cell systems (e.g., the sensor cell systems 104) via optics (e.g., the optics 106) to provide each of the at least one optical beam to each of the sensor cell systems to provide interaction of each of the at least one optical beam with sensing media in each of the respective sensor cell systems. One of the at least one optical beam exits each of the sensor cell systems as a respective detection beam (e.g., the detection beams $OPT_{DET}$). At 804, the detection beam from each of the sensor cell systems is monitored to determine a measurable parameter based on an optical characteristic associated with the detection beam from each of the sensor cell systems.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. An atomic sensor system comprising:
an optical source configured to provide an optical beam;
a plurality of sensor cell systems, each of the sensor cell systems comprising sensing media enclosed in a volume therein;
optics comprising a plurality of beamsplitters configured to provide a portion of the optical beam to each of the sensor cell systems to provide interaction of the optical beam with the sensing media in each of the respective sensor cell systems, the respective portion of the optical beam exiting each of the sensor cell systems as a respective detection beam; and
a detection system comprising at least one photodetector configured to receive the detection beam from each of the sensor cell systems and to determine a measurable parameter based on an optical characteristic associated with the detection beam from each of the sensor cell systems.

2. A method for determining a measurable parameter in an atomic sensor system, the method comprising:
providing an optical beam to a plurality of sensor cell systems via beamsplitters to provide a portion of the optical beam to each of the sensor cell systems to provide interaction of each respective portion of the optical beam with sensing media in each of the respective sensor cell systems, each portion of the optical beam exiting each of the sensor cell systems as a respective detection beam; and
monitoring the detection beam from each of the sensor cell systems to determine the measurable parameter based on an optical characteristic associated with the detection beam from each of the sensor cell systems.

3. A three-axis atomic sensor system comprising:
an optical source configured to provide an optical beam;
a first sensor cell system comprising sensing media and a first magnetic field generator arranged to provide a first magnetic field in a first vector direction;
a second sensor cell system comprising the sensing media and a second magnetic field generator arranged to provide a second magnetic field in a second vector direction different from the first vector direction;
a third sensor cell system comprising the sensing media and a third magnetic field generator arranged to provide a third magnetic field in a third vector direction different from the first and second vector directions, wherein the first, second, and third sensor cell systems are arranged in a 1×3 array;
optics configured to provide the optical beam parallel with respect to an arrangement of the first, second, and third sensor cell systems in the 1×3 array, the optics comprising a plurality of beamsplitters configured to provide a portion of the optical beam to each of the first, second, and third sensor cell systems to provide interaction of each of the respective optical beam with the sensing media in each of the respective first, second, and third sensor cell systems, the portion of the optical beam exiting each of the first, second, and third sensor cell systems being provided as a respective detection beam; and
a detection system comprising at least one photodetector configured to receive the detection beam from each of the first, second, and third sensor cell systems and to determine a measurable parameter based on an optical characteristic associated with the detection beam from each of the first, second, and third sensor cell systems.

4. The system of claim 1, wherein at least one of the sensor cell systems comprises a magnetic field generator configured to generate a magnetic field within the volume therein.

5. The system of claim 1, wherein the sensor cell systems are arranged in a 1×N array, wherein N is a quantity of the sensor cell systems, wherein the optical beam is provided parallel with respect to an arrangement of the sensor cell systems in the 1×N array.

6. The system of claim 1, wherein at least one of the sensor cell systems is redundant with respect to at least one other of the sensor cell systems, wherein the detection system is configured to at least one of calibrate the at least one other of the sensor cell systems and mitigate errors associated with the at least one other of the sensor cell systems based on the detection beam associated with the at least one redundant sensor cell system.

7. The system of claim 1, wherein the detection system comprises:
a plurality of photodetectors that are configured to monitor the optical characteristic of the detection beam of each of the respective sensor cell systems, the optical characteristic being one of a plurality of optical characteristics; and
a feedback photodetector configured to monitor the optical beam provided from the optical source to control at least one of the plurality of optical characteristics associated with the optical beam in a feedback manner.

8. The method of claim 2, wherein each of the sensor cell systems comprises a magnetic field generator configured to generate a magnetic field within a volume therein, wherein the sensor cell systems comprise:
a first sensor cell system, wherein the magnetic field generator of the first sensor cell system is arranged to provide the magnetic field in a first vector direction;

a second sensor cell system, wherein the magnetic field generator of the second sensor cell system is arranged to provide the magnetic field in a second vector direction different from the first vector direction; and a third sensor cell system, wherein the magnetic field generator of the third sensor cell system is arranged to provide the magnetic field in a third vector direction different from the first and second vector directions.

9. The system of claim 3, wherein each of the first, second, and third sensor cell systems are fabricated approximately identically, wherein the first sensor cell system is provided in a first orientation to provide the respective magnetic field in the first vector direction, wherein the second sensor cell system is provided in a second orientation to provide the respective magnetic field in the second vector direction, and wherein the third sensor cell system is provided in a third orientation to provide the respective magnetic field in the third vector direction, wherein at least one of the first, second, and third vector directions is non-orthogonal with respect to the other at least one of the first, second, and third vector directions.

10. The system of claim 3, wherein the optics further comprises:

a quarter-wave plate in an optical path between each portion of the optical beam and each of the first, second, and third sensor cell systems to provide a circularly-polarized optical beam to each of the first, second, and third sensor cell systems to provide a circularly-polarized detection beam associated with each of the first, second, and third sensor cell systems; and a retroreflector configured to reflect the circularly-polarized detection beam associated with each of the first, second, and third sensor cell systems back through the respective first, second, and third sensor cell systems.

11. The system of claim 3, wherein the detection system comprises:

a plurality of photodetectors that are configured to monitor the optical characteristic of the detection beam of each of the respective first, second, and third sensor cell systems, the optical characteristic being one of a plurality of optical characteristics; and a feedback photodetector configured to monitor the optical beam provided from the optical source to control at least one of the plurality of optical characteristics associated with the optical beam in a feedback manner.

12. The system of claim 4, wherein each of the sensor cell systems comprises the magnetic field generator, wherein the sensor cell systems comprise:

a first sensor cell system, wherein the magnetic field generator of the first sensor cell system is arranged to provide the magnetic field in a first vector direction;

a second sensor cell system, wherein the magnetic field generator of the second sensor cell system is arranged to provide the magnetic field in a second vector direction different from the first vector direction; and a third sensor cell system, wherein the magnetic field generator of the third sensor cell system is arranged to provide the magnetic field in a third vector direction different from the first and second vector directions.

13. The system of claim 5, wherein the optics further comprises:

a quarter-wave plate in an optical path between each portion of the optical beam and each of the sensor cell systems to provide a circularly-polarized optical beam to each of the sensor cell systems to provide a circularly-polarized detection beam associated with each of the sensor cell systems; and a retroreflector configured to reflect the circularly-polarized detection beam associated with each of the sensor cell systems back through the respective sensor cell system.

14. The method of claim 8, wherein providing the optical beam comprises:

providing a first portion of the optical beam through the first sensor cell system;

providing a second portion of the optical beam through the second sensor cell system; and providing a third portion of the optical beam through the third sensor cell system, wherein the first, second, and third portions of the optical beam are provided in parallel propagation paths, wherein monitoring the detection beam comprises determining the measurable parameter in three orthogonal axes based on first, second, and third detection beams associated with the respective first, second, and third portions of the optical beam.

15. The system of claim 9, wherein the first, second, and third portions of the optical beam are provided in parallel propagation paths through the respective first, second, and third sensor cell systems, wherein the detection system is configured to determine the measurable parameter in three orthogonal axes based on first, second, and third detection beams associated with the respective first, second, and third portions of the optical beam.

16. The system of claim 12, wherein each of the first, second, and third sensor cell systems are fabricated approximately identically, wherein the first sensor cell system is provided in a first orientation to provide the respective magnetic field in the first vector direction, wherein the second sensor cell system is provided in a second orientation to provide the respective magnetic field in the second vector direction, and wherein the third sensor cell system is provided in a third orientation to provide the respective magnetic field in the third vector direction.

17. The system of claim 12, wherein at least one of the first, second, and third vector directions is non-orthogonal with respect to the other at least one of the first, second, and third vector directions.

18. The system of claim 12, wherein the optical source is configured to provide a first portion of the optical beam through the first sensor cell system, a second portion of the optical beam through the second sensor cell system, and a third portion of the optical beam through the third sensor cell system, wherein the first, second, and third portions of the optical beams are provided in parallel propagation paths, wherein the detection system is configured to determine the measurable parameter in three orthogonal axes based on first, second, and third detection beams associated with the respective first, second, and third portion of the optical beam.

19. The system of claim 12, wherein the detection system is configured to determine the measurable parameter in three-dimensional space based on the detection beam from the first sensor cell system corresponding to a first vector component of the measurable parameter, based on the detection beam from the second sensor cell system corresponding to a second vector component of the measurable parameter, and based on the detection beam from the third sensor cell system corresponding to a third vector component of the measurable parameter, wherein the first, second, and third vector components are orthogonal with respect to each other.

20. A multi-axis atomic magnetometer or a multi-axis atomic gyroscope comprising the system of claim 19.

* * * * *